US010355058B2

(12) United States Patent
Miyamoto et al.

(10) Patent No.: US 10,355,058 B2
(45) Date of Patent: Jul. 16, 2019

(54) DISPLAY DEVICE

(71) Applicant: Japan Display Inc., Minato-ku (JP)

(72) Inventors: Mitsuhide Miyamoto, Minato-ku (JP);
Hayato Kurasawa, Minato-ku (JP);
Hiroshi Mizuhashi, Minato-ku (JP);
Takayuki Nakanishi, Minato-ku (JP);
Shuji Hayashi, Minato-ku (JP);
Yoshitoshi Kida, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/610,754

(22) Filed: Jun. 1, 2017

(65) Prior Publication Data

US 2017/0358631 A1 Dec. 14, 2017

(30) Foreign Application Priority Data

Jun. 10, 2016 (JP) ................................. 2016-116512

(51) Int. Cl.
*H01L 27/32* (2006.01)
*G06F 3/041* (2006.01)
(Continued)

(52) U.S. Cl.
CPC ............ *H01L 27/323* (2013.01); *G06F 3/044* (2013.01); *G06F 3/0412* (2013.01);
(Continued)

(58) Field of Classification Search
CPC ............... H01L 27/323; H01L 51/5281; H01L 51/5253; H01L 27/3246; H01L 51/5221;
(Continued)

(56) References Cited

U.S. PATENT DOCUMENTS 6,476,443 B1* 11/2002 Kinzer ................ H01L 29/0696
257/329
2008/0143251 A1* 6/2008 Mathea ............... H01L 51/0019
313/504
(Continued)

FOREIGN PATENT DOCUMENTS

JP 2014-186711 10/2014
KR 10-2014-0039470 A 4/2014
KR 10-2015-0026921 A 3/2015

OTHER PUBLICATIONS

Office Action dated Aug. 14, 2018 in Korean Patent Application No. 10-2017-0071588 with English translation, 7 pages.

*Primary Examiner* — Kenneth Bukowski
(74) *Attorney, Agent, or Firm* — Oblon, McClelland, Maier & Neustadt, L.L.P.

(57) ABSTRACT

A display device includes a plurality of first detection electrodes that are respectively disposed in a plurality of first areas, which are shaped in a stripe pattern and extend in the first direction, and extend in a first direction, an insulating layer that is disposed in a grid-like area, covers the first detection electrodes, and is placed on perimeters of pixel electrodes, and a plurality of second detection electrodes that are disposed on a sealing layer along a plurality of second areas and extend in a second direction, the second areas being included in the grid-like area, shaped in a stripe pattern, and extending in the second direction. The common electrodes are respectively disposed on a plurality of second banks and continue to the first direction.

7 Claims, 8 Drawing Sheets

(51) Int. Cl.
*G06F 3/044* (2006.01)
*H01L 51/52* (2006.01)

(52) U.S. Cl.
CPC ...... *H01L 27/3246* (2013.01); *H01L 51/5221* (2013.01); *G06F 2203/04103* (2013.01); *H01L 51/5253* (2013.01); *H01L 51/5281* (2013.01)

(58) Field of Classification Search
CPC ......... G06F 2203/04103; G06F 3/0412; G06F 3/044
See application file for complete search history.

(56) References Cited

U.S. PATENT DOCUMENTS

| | | | |
|---|---|---|---|
| 2009/0159894 A1* | 6/2009 | Yasumatsu | H01L 21/3003 257/72 |
| 2012/0306771 A1* | 12/2012 | Chen | G06F 3/0418 345/173 |
| 2014/0110735 A1* | 4/2014 | Sato | H01L 51/5228 257/98 |
| 2015/0355771 A1 | 12/2015 | Watazu et al. | |
| 2017/0108979 A1* | 4/2017 | Lu | G06F 3/0416 |
| 2017/0213873 A1* | 7/2017 | Bok | H01L 27/323 |

* cited by examiner

DISPLAY DEVICE

CROSS-REFERENCE TO RELATED APPLICATION

The present application claims priority from Japanese application JP2016-116512 filed on Jun. 10, 2016, the content of which is hereby incorporated by reference into this application.

BACKGROUND OF THE INVENTION

1. Field of the Invention

The present invention relates to a display device.

2. Description of the Related Art

A capacitive touch panel has been widely used for a touch panel of a mobile display, such as a smartphone (JP2014-186711A). In many cases, touch panels have been formed separately from displays, although demand for integrated touch panels has been increasing in view of superiority in thinness, low cost, and optical properties.

Touch panels, especially capacitive touch panels, are desirably disposed near a display surface, that is, an upper part of a display element. However, if all of electrodes of the touch panel are disposed in the upper part of the display, such a structure is inferior in thinness, costs, and optical properties similarly to the structure with a separated touch panel. Further, influence on an element that needs to avoid moisture and high temperature, such as an organic electroluminescence element, should be considered.

SUMMARY OF THE INVENTION

One or more embodiments of the present invention have been conceived in view of the above, and an object thereof is to provide a thin, low-cost display device having high optical properties and integrating a touch sensor in view of an influence on a display element.

A display device according to the present invention includes a plurality of pixel electrodes, a grid-like area formed by spaces between adjacent pixel electrodes, a plurality of first detection electrodes that are respectively disposed in a plurality of first areas and extend in a first direction, the first areas being included in the grid-like area, shaped in a stripe pattern, and extending in the first direction, an insulating layer that is disposed in the grid-like area, covers the first detection electrodes, and is placed on perimeters of the pixel electrodes, a plurality of light-emitting layers that are respectively disposed on the pixel electrodes, a plurality of common electrodes that avoid overlapping the first detection electrodes and are respectively disposed on the light-emitting layers over the pixel electrodes, a sealing layer that covers the common electrodes, a plurality of second detection electrodes that are disposed on the sealing layer along a plurality of second areas and extend in a second direction, the second areas being included in the grid-like area, shaped in a stripe pattern, and extending in the second direction. The insulating layer includes a plurality of first banks and a plurality of second banks, the first banks continuously extending in the first direction along the first areas, the second banks respectively connecting adjacent first banks along the second areas. The common electrodes are respectively disposed on the second banks and continue to the first direction.

According to the present invention, the first detection electrodes and the pixel electrodes can be included in the same layer. As such, thickness of the first detection electrodes and the pixel electrodes can be reduced, and the cost can be lowered by forming them at the same time. Further, the first detection electrodes and the pixel electrodes can be formed in advance so as not to influence on the light-emitting layers. The first detection electrodes also have superior optical properties, because each first detection electrode is disposed between adjacent pixel electrodes and does not overlap the light emitting area.

DETAILED DESCRIPTION OF THE INVENTION

Embodiments of the present invention will be described below in detail with reference to the accompanying drawings. However, the present invention can be changed and modified in various manners as appropriate without departing from the spirit of the invention, and is not to be limited to the embodiments described below.

In the accompanying drawings, widths, thicknesses, shapes, or other characteristics of each part are schematically illustrated for clarity of illustration compared to actual configurations, although such a schematic illustration is merely an example and not intended to limit the present invention. In the present specification and drawings, some elements identical or similar to those shown previously are denoted by the same reference signs as the previously shown elements, and thus repetitive detailed descriptions of them may be omitted as appropriate.

Further, in the embodiments, when a positional relationship between a component and another component is defined, if not otherwise stated, the words "on" and "below" suggest not only a case where the another component is disposed immediately on or below the component, but also a case where the component is disposed on or below the another component with a third component interposed therebetween.

[First Embodiment]

Figure 1:
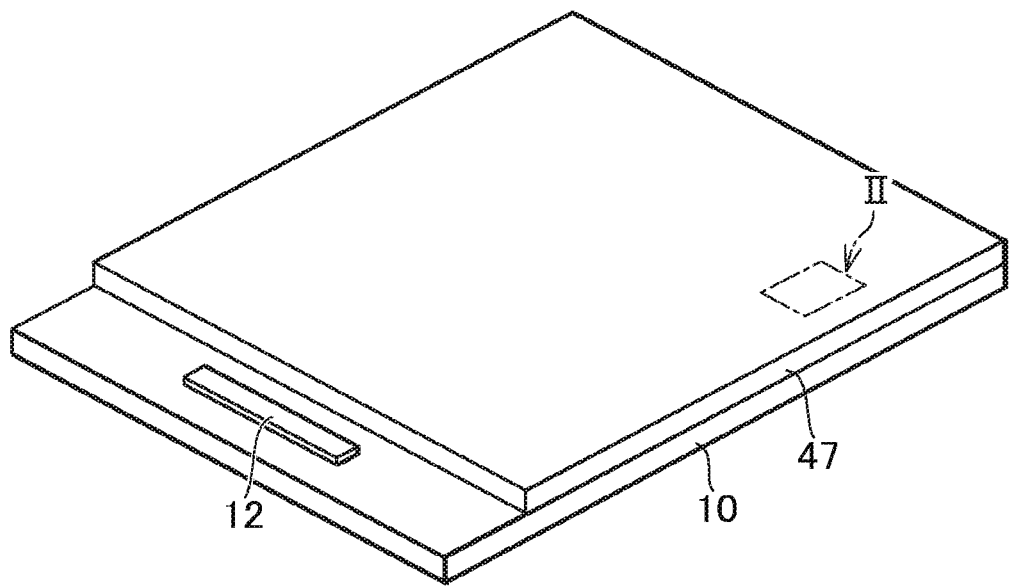
FIG. 1 is a perspective view of a display device according to the first embodiment of the present invention.

FIG. 1 is a perspective view of a display device according to the first embodiment of the present invention. An organic electroluminescent display device is taken as an example of a display device. For example, the display device combines unit pixels (sub-pixels) in a plurality of colors including red, green, and blue to form full-colored pixels, and displays a full-colored image. The display device includes a first substrate 10. The first substrate 10 includes an integrated circuit chip 12 that drives elements for displaying an image, and may be connected to a flexible printed substrate (not shown) for external electrical connection.

Figure 2:
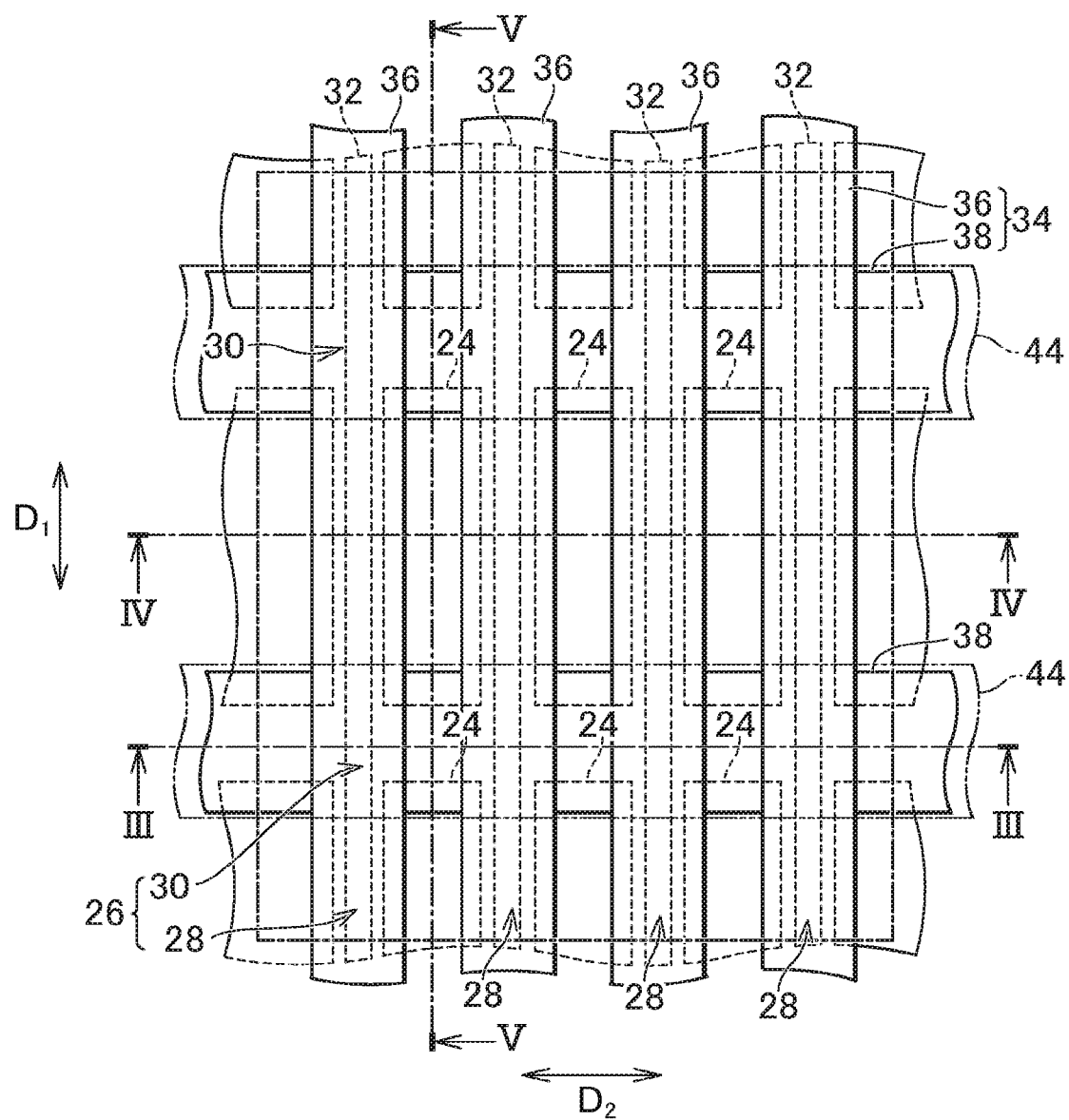
FIG. 2 is an enlarged view of a portion indicated by II in FIG. 1.
Figure 3:
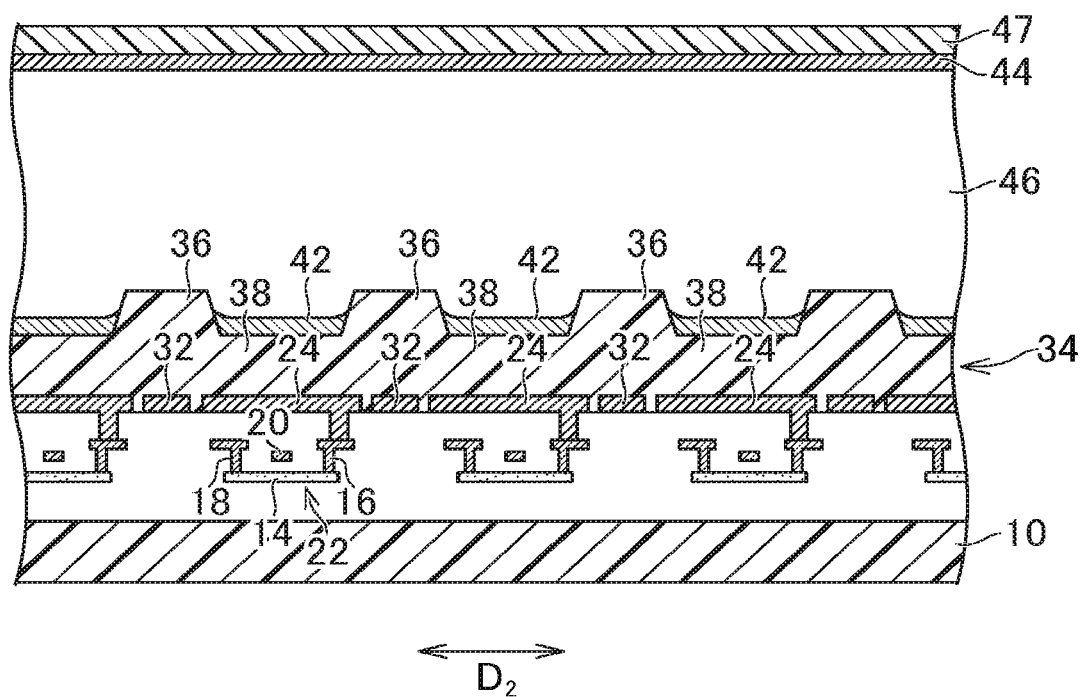
FIG. 3 is an enlarged cross-sectional view of the display device taken along the line shown in FIG. 2.

FIG. 2 is an enlarged view of a portion indicated by II in FIG. 1. FIG. 3 is an enlarged cross-sectional view of the display device taken along the line shown in FIG. 2. The first substrate 10 is made of resin or glass. An insulating film is formed on the first substrate 10, and a semiconductor layer 14 is formed on the insulating film. A source electrode 16 and a drain electrode 18 are electrically connected to the semiconductor layer 14, and a gate electrode 20 is disposed on the semiconductor layer 14 through a gate insulating film. A thin film transistor 22 is composed of the semiconductor layer 14, the source electrode 16, the drain electrode 18, and the gate electrode 20.

A plurality of pixel electrodes 24 are disposed so as to connect to the thin film transistor 22. The pixel electrodes 24 are arranged in a matrix as shown in FIG. 2, and grid-like areas 26 are interposed between adjacent pixel electrodes 24. The grid-like areas 26 include a plurality of first areas 28 in stripes extending in a first direction D1. The grid-like areas 26 include a plurality of second areas 30 in stripes extending in a second direction D2. The first direction D1 and the second direction D2 intersect (e.g., at right angles) each other.

A plurality of first detection electrodes 32 are respectively disposed on the first areas 28. Each of the first detection electrodes 32 is disposed between pixel electrodes 24 adjacent in the second direction D2, and extends in the first direction D1. As shown in FIG. 3, the pixel electrodes 24 and the first detection electrodes 32 are included in the same layer and formed of the same material. As such, the pixel electrodes 24 and the first detection electrodes 32 can be formed at the same time.

Figure 4:
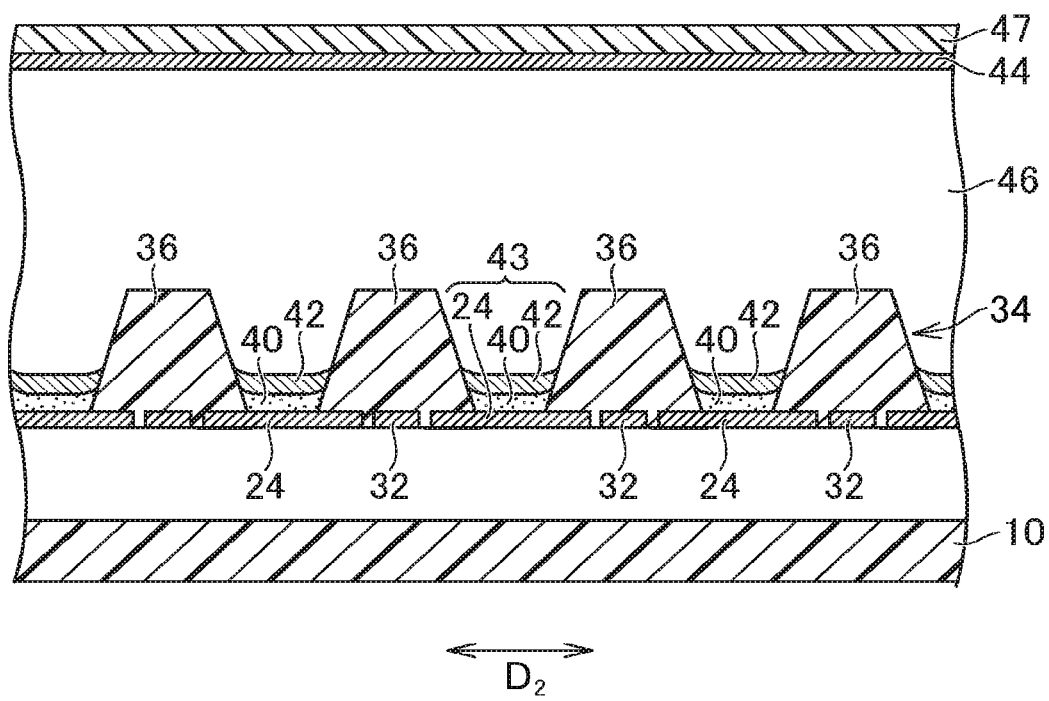
FIG. 4 is an enlarged cross-sectional view of the display device taken along the line IV-IV shown in FIG. 2.
Figure 5:
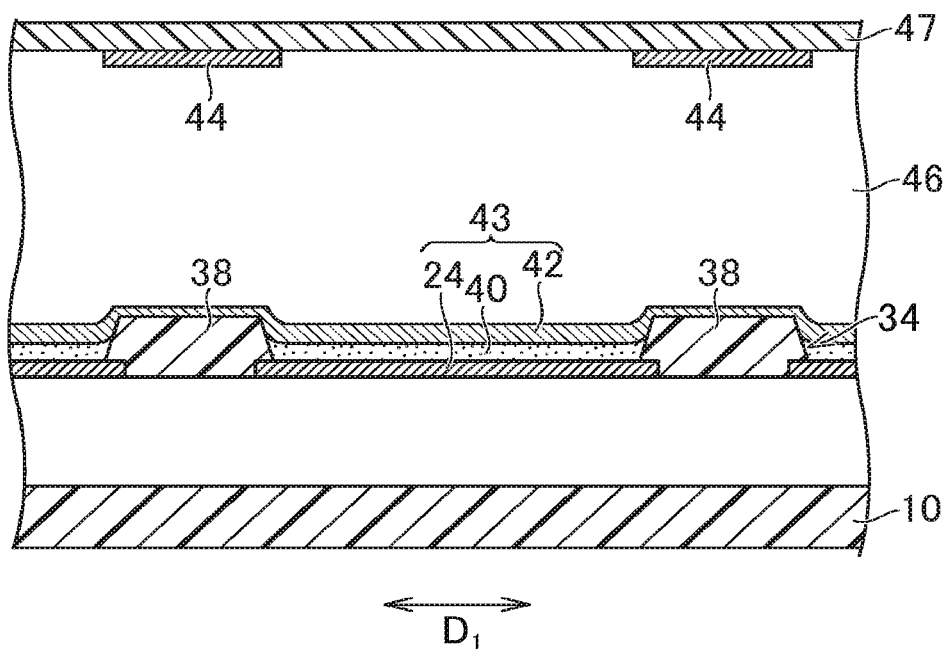
FIG. 5 is an enlarged cross-sectional view of the display device taken along the line V-V shown in FIG. 2.

FIG. 4 is an enlarged cross-sectional view of the display device taken along the line IV-IV shown in FIG. 2. FIG. 5 is an enlarged cross-sectional view of the display device taken along the line V-V shown in FIG. 2. An insulating layer 34 is disposed on the first detection electrodes 32 and on the perimeters of the pixel electrodes 24 so as to insulate common electrodes 42 described later. The insulating layer 34 has a plurality of first banks 36. The first banks 36 continuously extend in the first direction D1 along first areas 28. The first banks 36 are disposed on the first areas 28, project from the first areas 28, and are disposed on the perimeters of the pixel electrodes 24. The insulating layer 34 has a plurality of second banks 38. The second banks 38 are disposed on second areas 30, project from the second areas 30, and are disposed on the perimeters of the pixel electrodes 24. The second banks 38 are respectively connected to adjacent first banks 36 along the second area 30. The first banks 36 and the second banks 38 arranged in a grid manner.

As apparent from the comparison between FIG. 4 and FIG. 5, the height of the second banks 38 are lower than the height of the first banks 36. Such first banks 36 and second banks 38 having different height can be formed by the photolithographic process including the exposure using the half tone mask.

The insulating layer 34 is disposed in the grid-like areas 26 (see FIG. 2), which respectively separate the pixel electrodes 24, and disposed on the perimeters of the pixel electrodes 24 so as to make an opening on a part (e.g., the center) of the pixel electrodes 24. Further, the insulating layer 34 (first banks 36) covers the first detection electrodes 32.

Light-emitting layers 40 are disposed on the pixel electrodes 24. The light-emitting layers 40 are respectively (separately) provided to the pixel electrodes 24, and emit light in blue, red, and green colors in accordance with respective pixels. The light-emitting layer 40 at least partially (or completely in the display area) avoid overlapping with the first detection electrodes 32.

The common electrodes 42 are disposed on the light-emitting layers 40, which are disposed on the pixel electrodes 24. As shown in FIG. 5, each of the common electrodes 42 is disposed on a plurality of second banks 38 and continues in the first direction D1. In other words, each common electrode 42 is continuously disposed across light-emitting layers 40 adjacent in the first direction D1. On the other hand, as shown in FIG. 4, the insulating layers 34 (first banks 36) are disposed between adjacent common electrodes 42 on the light-emitting layers 40 adjacent in the second direction D2. The common electrodes 42 adjacent in the second direction D2 are entirely separated at least in the display area. With this configuration, the common electrodes 42 avoid overlapping with the first detection electrodes 32.

For example, a plurality of common electrodes 42 can be formed by forming a conductive film so as to cover the entire insulating layers 34, and mechanically polishing or mechanically chemically polishing and removing the conductive film on the first banks 36, which are placed at positions higher than the light-emitting layers 40 and the second banks 38, while leaving the conductive film on the light-emitting layers 40.

A light emitting element layer 43 is formed of a light-emitting layer 40, a pixel electrode 24, and a common electrode 42, where the light-emitting layer 40 is disposed between the pixel electrode 24 and the common electrode 42. The light emitting element layer 40 is disposed between the pixel electrode 24 and the common electrode 42, controlled in brightness by an electric current that flows between them, and emits light. At least one of a hole transport layer and a hole injection layer (both are not shown) may be provided between the light-emitting layer 40 and the pixel electrode 24. At least one of an electron transport layer and an electron injection layer (both are not shown) may be provided between the light-emitting layer 40 and the common electrode 42.

The light emitting element layer 43 is covered by a sealing layer 46 stacked on the common electrode 42, and is thus sealed and protected from moisture. The sealing layer 46 may include an inorganic film such as SiN, and be configured of a pair of inorganic films between which an organic film, such as resin, is disposed. The sealing layer 46 covers a plurality of common electrodes 42.

A plurality of second detection electrodes 44 are disposed on the sealing layer 46. As shown in FIG. 2, the second detection electrodes 44 extend in the second direction D2 along the second areas 30. For example, the second detection electrodes 44 are respectively disposed directly on the second areas 30. The second detection electrodes 44 may project from the second areas 30 and overlap the second banks 38 or the perimeters of the pixel electrodes 24. The second detection electrode 44 may be formed of a transparent conductive film, such as indium tin oxide, or formed of metal. In a case where the perimeter of the second detection electrode 44 is formed in a zig-zag shape, the second detection electrode 44 is hard to be visually recognized and thus does not disturb the image display.

The first detection electrodes 32 and the second detection electrodes 44 are used to detect a touch of an electric conductor, such as a finger, and employ a principle of mutual capacitance, for example. Specifically, a pulse is applied to each of the first detection electrodes 32 to generate an electric field. The insulating layer 34 and the sealing layer 46 are disposed on the first detection electrodes 32, and, using these layers as dielectrics, the capacitance is formed between the first detection electrodes 32 and the second detection electrodes 44. A touch can be detected by detecting a change in the capacitance formed between the first detection electrodes 32 and the second detection electrodes 44.

A second substrate 47 is disposed on the second detection electrodes 44. The second substrate 47 is a film made of resin, for example. The second substrate 47 may be adhered to the plurality of second detection electrodes 44. Alternatively, a second substrate 47 including a plurality of second detection electrodes 44 may be prepared and adhered to the sealing layer 46.

In this embodiment, a plurality of first detection electrodes 32 and a plurality of pixel electrodes 24 can be included in the same layer. As such, thickness of the first detection electrodes 32 and the pixel electrodes 24 can be reduced, and the cost can be lowered by forming them at the same time. Further, the first detection electrodes 32 and the pixel electrodes 24 can be formed in advance so as not to influence on the light-emitting layers 40. The first detection electrodes 32 also have superior optical properties, because each first detection electrode 32 is disposed between adjacent pixel electrodes 24 and does not overlap the light emitting area.

[Second Embodiment]

Figure 6:
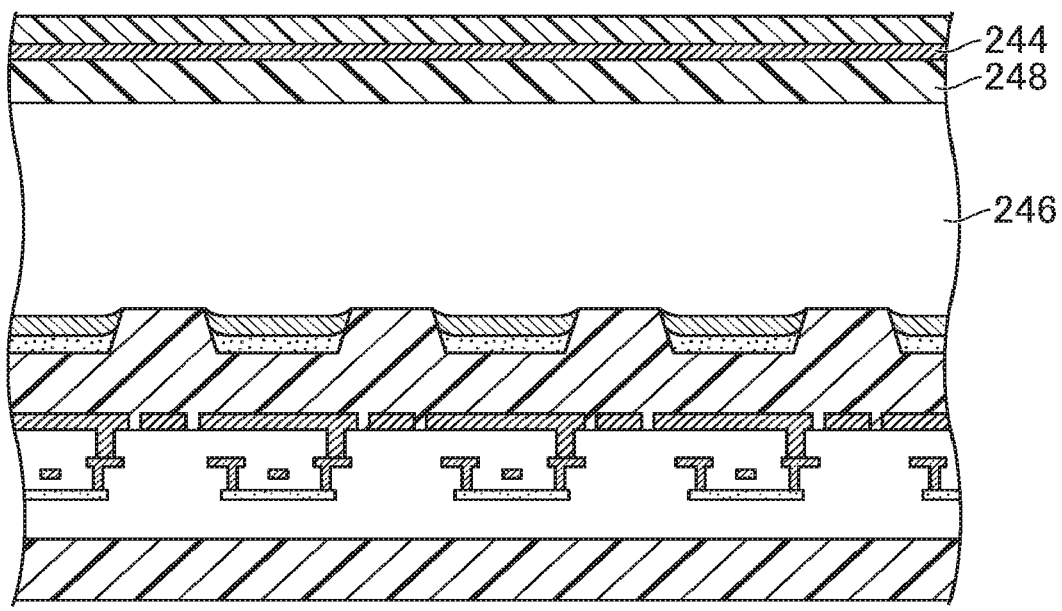
FIG. 6 is a cross-sectional view of the display device according to the second embodiment of the present invention.

FIG. 6 is a cross-sectional view of the display device according to the second embodiment of the present invention. In this embodiment, a circular polarizing plate 248 is disposed between the sealing layer 246 and the second detection electrodes 244 in order to reduce reflection of the outer light. This configuration is obtained by preparing a circular polarizing plate 248 on which a plurality of second detection electrodes 244 are formed, and adhering the circular polarizing plate 248 to the sealing layer 246. Other details are the same as those described in the first embodiment.

[Third Embodiment]

Figure 7:
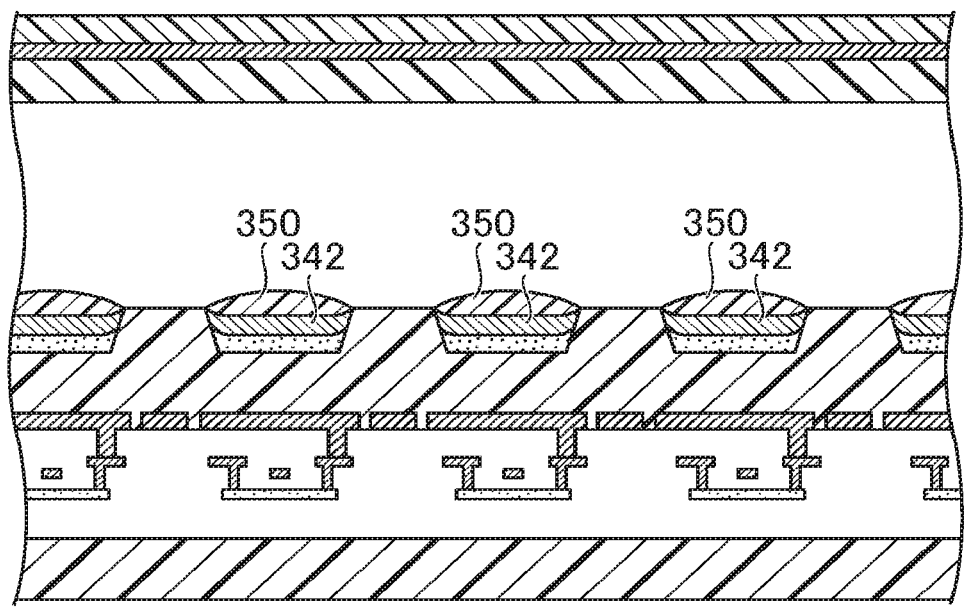
FIG. 7 is a cross-sectional view of the display device according to the third embodiment of the present invention.

FIG. 7 is a cross-sectional view of the display device according to the third embodiment of the present invention. In this embodiment, protective layers 350 respectively cover common electrodes 342. The protective layers 350 have light transmissivity and may be formed of resin. When being formed, the protective layers 350 may constitute lenses by being curved at the surfaces with surface tension. The protective layers 350 respectively cover the common electrodes 342. In the manufacturing process, a protective layer 350 is provided in the form of a common electrode 342 on a conductive film for patterning on the common electrode 342, and the conductive film is etched to form the common electrode 42 using the protective layer 350 as an etching mask. As such, the perimeters of the protective layers 350 respectively match the perimeters of the common electrodes 342. An ink jet system may be used to form the protective layers 350. Other details are the same as those described in the first embodiment.

[Fourth Embodiment]

Figure 8:
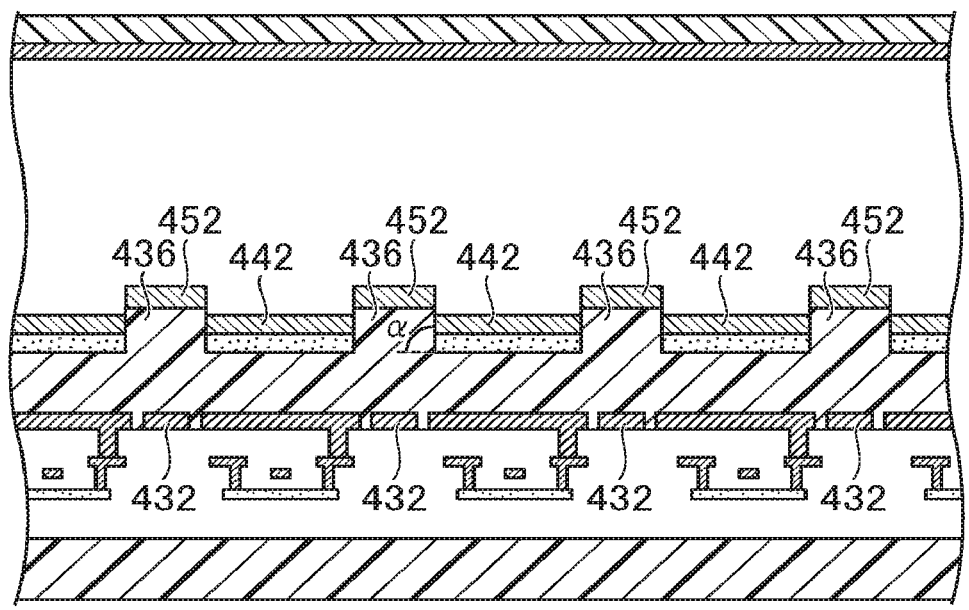
FIG. 8 is a cross-sectional view of the display device according to the fourth embodiment of the present invention.

FIG. 8 is a cross-sectional view of the display device according to the fourth embodiment of the present invention. In this embodiment, conductive layers 452 are respectively disposed on first banks 436, and cover first detection electrodes 432. In this regard, however, each conductive layers 452 is separated and electrically isolated (not connected to a wirings or an electrode) from an adjacent common electrode 442, and thus does not shield the electric field from the first detection electrodes 432.

In this embodiment, side surfaces of the first banks 436 are raised steeply. For example, an inclination angle α of the side surface is desirably at least 80 degrees or more (e.g., 90 degrees), and may be more than 90 degrees. Because of this shape, when a conductive film for patterning on the common electrodes 442 is provided all over, the conductive film does not adhere to the side surface of the first bank 436 and is disconnected. With this configuration, a conductive layer 452 can be isolated and left on a first bank 436. Other details are the same as those described in the first embodiment.

The display device is not limited to an organic electroluminescent display device, and may be a display device having a light-emitting element such as a quantum-dot light emitting diode (QLED) in each pixel.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
a substrate;
a plurality of transistors on the substrate;
a plurality of pixel electrodes disposed over and electrically connected to the respective transistors;
a grid-like area formed by spaces between adjacent pixel electrodes;
a plurality of first detection electrodes that are respectively disposed in a plurality of first areas and extend in a first direction, the first areas being included in the grid-like area, shaped in a stripe pattern, and extending in the first direction;
an insulating layer that is disposed in the grid-like area, covers the first detection electrodes, and is placed on perimeters of the pixel electrodes;
a plurality of light-emitting layers that are respectively disposed on the pixel electrodes;
a plurality of common electrodes that avoid overlapping the first detection electrodes and are respectively disposed on the light-emitting layers over the pixel electrodes;
a sealing layer that covers the common electrodes; and
a plurality of second detection electrodes that are disposed on the sealing layer along a plurality of second areas and extend in a second direction, the second areas being included in the grid-like area, shaped in a stripe pattern, and extending in the second direction, wherein
the insulating layer is continuous, composed of a same material, and includes a plurality of first banks and a plurality of second banks, the first banks continuously extending in the first direction along the first areas and covering the respective first detection electrodes, the second banks respectively connecting adjacent first banks along the second areas,
each of the first banks has a first top, which is more distant from the substrate than a second top of each of the second banks,
the common electrodes are respectively disposed on the second banks and continue to the first direction, and
wherein the first banks completely cover the first detection electrodes.

2. The display device according to claim 1, wherein the second banks are lower than the first banks in height.

3. The display device according to claim 1, wherein the pixel electrodes and the first detection electrodes are included in a same layer.

4. The display device according to claim 1, further comprising a plurality of protective layers respectively covering the common electrodes, wherein
perimeters of the protective layers respectively match perimeters of the common electrodes.

5. The display device according to claim 1, further comprising a plurality of conductive films that are respectively disposed on the first banks, each conductive film being separated and electrically isolated from an adjacent common electrode.

6. The display device according to claim 1, further comprising a circular polarizing plate between the sealing layer and the second detection electrodes.

7. The display device according to claim 1, wherein
the light-emitting layers are disposed so as not to overlap the first detection electrodes.

* * * * *